United States Patent

Cole

[15] 3,654,697

[45] Apr. 11, 1972

[54] METHOD OF MAKING THIN PLATED WIRE MEMORY

[72] Inventor: John M. Cole, New Hope, Pa.

[73] Assignee: Thomas & Betts Corporation, Elizabeth, N.J.

[22] Filed: Oct. 19, 1970

[21] Appl. No.: 81,915

[52] U.S. Cl. ....................29/604, 29/625, 340/174 PW

[51] Int. Cl. ....................H01f 7/06

[58] Field of Search .......29/604, 625; 340/174 PW, 174 VA, 340/174 MA; 156/179

[56] References Cited

UNITED STATES PATENTS

| | | | |
|---|---|---|---|
| 3,465,432 | 9/1969 | Crimmins et al. | 29/604 |
| 3,534,343 | 10/1970 | Sallet | 340/174 PW |
| 3,538,599 | 11/1970 | Michaud | 29/604 |

*Primary Examiner*—John F. Campbell
*Assistant Examiner*—Carl E. Hall
*Attorney*—Thomas M. Marshall

[57] ABSTRACT

A method of making a plated wire memory plane comprises laminating two sheets of copper clad dielectric material around a plurality of generally parallel manufacture wires in a continuous lamination technique, with each copper sheet having suitable apertures therein to enable inspection of the spacing or pitch between said manufacture wires during lamination step. Suitable tooling holes are drilled in the resulting laminated structure, after which the copper foil sheets are etched to produce the word lines which extend generally perpendicular to the manufacture wires, and with the word lines being in registration above and below said manufacture wires. The latter are then withdrawn from the dielectric material and magnetically plated wires are inserted in the resulting tunnel thereby completing the memory plane.

10 Claims, 6 Drawing Figures

INVENTOR.
JOHN M. COLE
BY
Thomas M Marshall
ATTORNEY

METHOD OF MAKING THIN PLATED WIRE MEMORY

The present invention relates to the field of non-destructive read-out (N.D.R.O.) memory storage planes, and more particularly to an improved method of making a plated wire memory plane.

Basically, a plated wire memory plane comprises a dielectric supporting medium for supporting a plurality of generally parallel plated wires, and two word strap assemblies, each of which comprises a plurality of parallel conductors mounted on a dielectric sheet and bonded to each side of said plated wire memory support unit. The cross-over points of the plated wires and word straps are known as "bits." In order to increase the efficiency of the memory plane, it is desirable that the conductors be positioned as close as possible to the plated wires, and furthermore, that the respective conductors above and below the intermediate plated wire support unit be in exact registration whereby, upon passage of a current through said word lines, the respective magnetic fields generated by the word straps above and below the plated wires will effectively provide the most efficient magnetic field pattern for inducing a read-out current in said plated wire.

It is readily apparent that unnecessary spacing between the word lines (also known as word straps) and the plated wires and also mis-registration of the respective word straps above and below the plated wires, will give rise to inefficient operation of the memory plane. More particularly, the amount of current needed to "drive" the memory or, in other words, to induce an output current in the plated wires, is proportional to the amount of spacing between the word lines and the plated wires. Increased spacing necessitates greater drive currents. Likewise, mis-registration of the respective word straps above and below the plated wires gives rise to interference between the respective magnetic flux fields generated by said word straps above and below the plated wires, and as a result, the resulting magnetic effect upon the adjacent plated wires may be insufficient to generate an output voltage. Accordingly, in view of this situation, it may be necessary to increase the drive current passed through the word straps so as to produce a sufficient magnetic flux to cause the desired output voltage in the plated wires. However, in turn, this may give rise to cross-talk or interference between adjacent pairs of word straps and between successive "bits," thereby rendering the operation of the memory plane questionable. In summary, an efficient memory plane is one in which the word straps are as close as possible to the plated wires without causing a short in the circuitry, and in which the word straps above and below the plated wires are in registration.

Heretofore, memory planes have been made by preparing three separate structures, a plated wire memory support medium and two word strap assemblies, and then subjecting the three structures to a lamination process to complete the memory plane. This lamination step gives rise to certain deficiencies in the memory plane, notably mis-registration of the word straps above and below the tunnel structure. The latter is caused by "swimming" or relative movement of the conductors in the dielectric material as the latter is heated during the lamination operation. Stated differently, during the lamination operation, the dielectric material to which the word straps are bonded, and which forms the support structure for the plated wires, softens and flows, thereby possibly giving rise to an unbalanced pressure on a word strap which will cause it to shift laterally thereby resulting in mis-registration of the word straps above and below the tunnel structure.

The present invention overcomes the deficiencies of the prior art techniques of making plated wire memory planes by first forming a composite assembly of a plated wire support structure clad on its opposite sides with sheets of copper foil. Secondly, the upper and lower sheets of copper foil are etched simultaneously so as to define the word straps above and below the memory storage unit. During the second step and in the remaining steps required to complete the plated wire memory plane, the composite structure is not subjected to a lamination technique whereby the word straps at no time are subjected to additional heat and pressure which may cause swimming or lateral shifting of the word straps which has given rise to mis-registration in the prior art techniques. With the use of suitable guides or tooling holes drilled in the composite assembly, the word straps may be accurately located so as to ensure registration of the word straps during the etching process. Furthermore, in that the copper foil sheets are directly bonded to the memory storage unit, they are in close proximity to the plated wires, thereby further enhancing the efficiency of the resulting memory plane.

Briefly, the method of the present invention employs a continuous lamination technique so that the resulting structure may be produced in a continuous manner so as to minimize the cost of manufacturing the memory plane. Preferably, the raw materials used in the process of the subject invention, comprises sheets of Kapton, sheets of FEP teflon and sheets of copper foil. A composite lamination of a sheet each of copper foil, Kapton and FEP (or only copper foil and FEP) are laminated together to form a composite unit, after which suitable apertures are formed in the copper foil as, for instance, by the use of a photoetch technique. The copper clad dielectric sheets are then laminated together with the copper foil being disposed on the outside of the laminate, and a plurality of generally parallel manufacture wires, which may consist of steel or monel wires, being embedded between said two sheets, with the resulting structure being a plated wire support unit clad on its opposite sides with sheets of copper foil. The thickness of the dielectric of each copper clad sheet is sufficient to ensure that the manufacture wires embedded in the resulting laminate do not touch the copper foil sheets.

During the lamination process, suitable means are employed to ensure the maintenance of the pitch or transverse spacing between the manufacture wires. Preferably, the pitch monitoring means comprises an optical scanning device which "views" the embedded manufacture wires through the apertures previously photoetched into each copper clad dielectric sheet. The resulting laminate is cut to length, after which registration holes, to be used during subsequent operations, are drilled into the laminate. Next, the word straps are etched above and below the memory support unit. If desired, holes may be drilled through the laminate prior to the etching of the word straps, which holes may then be plated and will eventually be used as the "turn-arounds" for the word straps. After the word strap structure has been formed, the manufacture wires are pulled out of the resulting laminate, and magnetically plated wires are inserted in the resulting holes thereby completing the memory plane.

A memory plane made according to the process of the subject invention is characterized by a minimum distance between the plated wires and the word straps, and also by substantially perfect alignment or registration between the word straps disposed above and below the plated wires.

DESCRIPTION OF THE PREFERRED EMBODIMENT

Figures 1, 2, 3, 4, 5, 6:
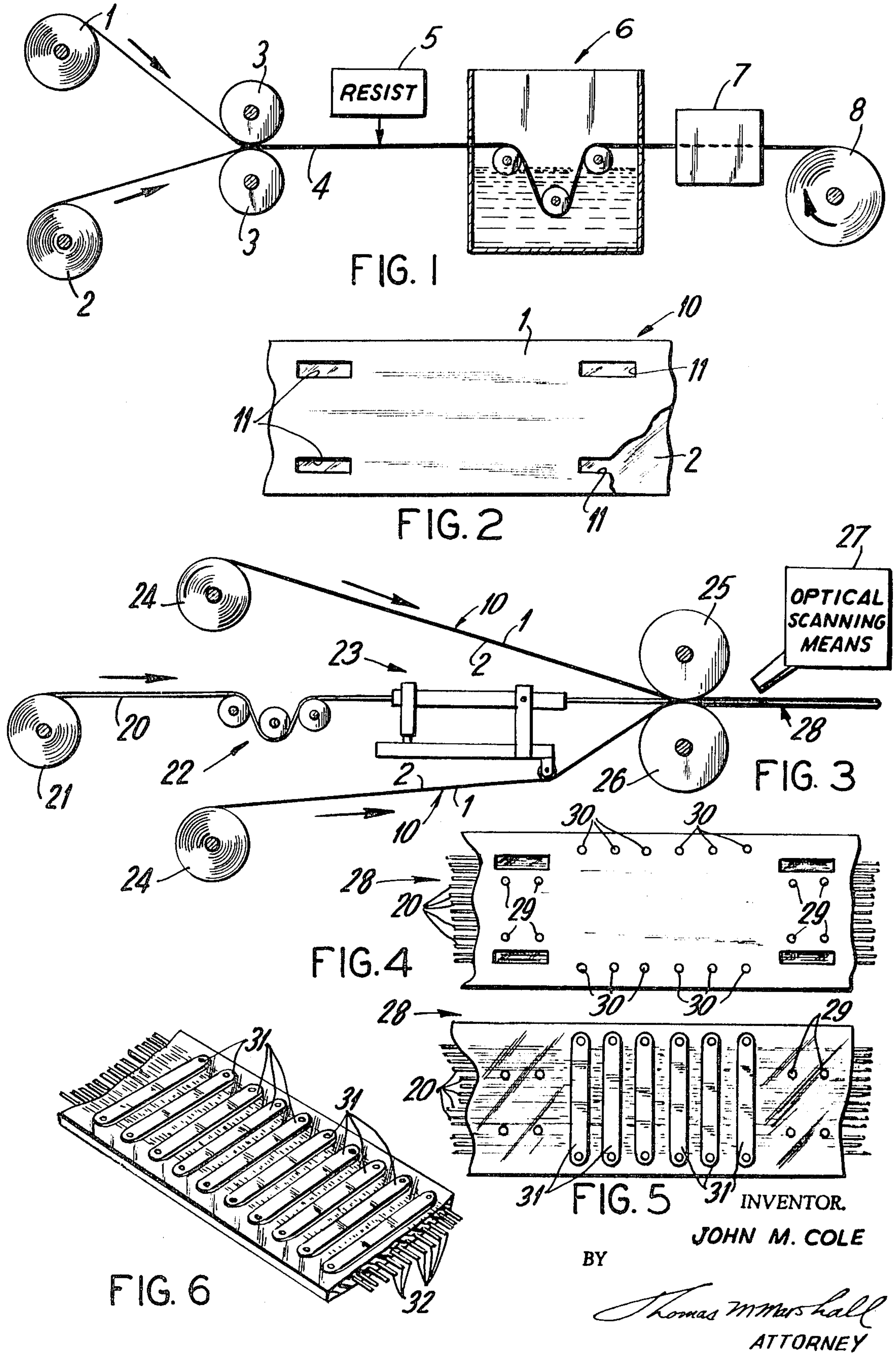
FIG. 1 illustrates a schematic of the apparatus for making a continuous composite sheet of copper clad dielectric for use in the method of the subject invention.
FIG. 2 illustrates a plan view of the copper-clad dielectric used in the process of the subject invention.
FIG. 3 schematically illustrates the apparatus used in the first step of the method of the subject invention.
FIGS. 4 and 5 illustrate subsequent steps in the method of the subject invention.
FIG. 6 illustrates a completed memory plane.

The first step in the process of making a memory plane according to the subject invention is to provide a continuous sheet of copper foil material laminated to a sheet of dielectric material, and provide suitable apertures in the copper foil. The apertures are required in the second lamination step to be described hereinafter. The copper sheet of the copper clad lamination will eventually be etched to provide the word lines, while the dielectric material will subsequently be used for encapsulating the plated wires of the plated wire memory plane.

Turning to FIG. 1, there is schematically illustrated apparatus for continuously making a composite copper clad dielectric sheet having apertures therein. A continuous strip of copper foil from roll 1 and a continuous strip of suitable dielectric material from roll 2 are passed between the nips of rollers 3 to form a sheet of copper clad dielectric material. The dielectric material may comprise a single layer of suitable plastic material such as Kapton, or a multilayer arrangement of, for example, Kapton and FEP teflon.

Continuing with the preparation of the basic material to be used in the subject process, the copper clad dielectric material is preferably etched in a continuous process. This is shown in FIG. 1 wherein the copper clad dielectric sheet, designated by the numeral 4, is coated, as at 5, with a layer of resist or other material unaffected by etchant in a pattern duplicating the desired etched pattern. After the resist pattern has been applied, unwanted conductive material from the copper foil 1 is etched away, as at 6, by means of a suitable etchant such as ferric chloride, chromic acid, cupric chloride, ammonium persulfate or the like, disposed in a bath. The etched copper clad dielectric material is passed through a washing bath 7 and accumulated on roll 8.

FIG. 2 illustrates the resulting etched copper clad dielectric sheet material 10 comprising the copper foil 1 bonded to the dielectric 2, and having a plurality of spaced apertures 11 disposed along the lateral edges of material 10. As an example of the dimensions of sheet material 10, the width of material 10 may be on the order of 4 to 8 inches, while the apertures may be one-quarter inch wide and as much as 1 inch long, with the apertures being spaced at approximately 25-inch intervals along the length of copper clad dielectric material 10.

In the manufacture of the memory plane according to the process of the present invention, two sheets of copper clad dielectric material 10 are bonded together with a plurality of manufacture wires disposed between the sheet materials. The resulting composite assembly is characterized by the copper foils being disposed on opposite sides of the assembly, and the manufacture wires being totally embedded or encapsulated in the dielectric portions of the material 10. The manufacture wires are subsequently withdrawn to define a plurality of generally parallel holes or tunnels into which the plated wires are inserted. The copper sheets are etched to define the word strap patterns above and below the plated wires.

Turning to FIG. 3, a plurality of manufacture wires, which may also be termed hole-forming wires 20, coiled up on wheels 21 are passed between tensioning rolls 22. Individual wires 20 are fed into a suitable positioning mechanism 23. Individual wires 20 are fed between the copper clad dielectric sheet material 10, 10 (respectively rolled up on wheels 24, 24), into the nip of rolls 25 and 26. Depending upon the nature of the dielectric sheets, rolls 25 and 26 by means of suitable pressure and/or heat cause the bonding together of copper clad dielectric materials 10, 10, about wires 20 to form a cohesive strip of copper clad insulating material having the plurality of generally parallel wires 20 embedded therein so that the latter are insulated from each other and also insulated from the copper foils 1, 1 of the respective sheets 10, 10. If, for example, the dielectric material of sheets 10 are of thermoplastic material, it is desirable that either or both rolls 25, 26 be heated so that through the application of pressure and heat, rolls 25 and 26 cause the thermoplastic sheets to become bonded to one another while encasing the individual parallel wires 20.

As the resulting composite structure leaves the rolls, it is desirable that suitable means be provided in order to determine whether or not the individual wires 20 are spaced at proper intervals. To this end, conventional optical scanning means 27, are employed to sample and measure the spacing between a selective number of manufacture wires 20 disposed in the composite laminated sheet, designated by the numeral 28. In that the opposite sides of the composite sheet 28 are clad with copper foil, the optical scanning means "view" the manufacture wires exposed through the apertures 11 formed in each of the materials 10, 10. In order to allow sufficient light to pass through the composite structure 28, it is readily apparent that the apertures above and below the composite sheet 28 should be in substantial registration. In that the manufacture wires may be spaced on the order of 25/1000 inch, and in that the apertures may be 0.25 inch in width, the optical scanning means will be able to sample approximately 10 manufacture wires along both lateral edges of the composite sheet 28. During a lamination operation, the operator of the apparatus can readily mark any portion of the continuous structure 28 whereat the pitch or transverse spacing between adjacent construction or manufacture wires is not maintained, and ultimately this section may be discarded.

The next step in the subject process of making a plated wire memory plane is to provide a reference in the structure 28 for use during the etching of the word straps in order to ensure that the latter are in substantially perfect registration above and below the plated wires. Turning to FIG. 4, this may be accomplished by first cutting the continuous length of composite sheet material 28 to a slightly greater length than the length of the desired memory plane, and drilling suitable tooling holes 29 at positions beyond the length of the desired memory plane. The composite sheet 28 is fairly rigid at this point in the process in that it includes sheets of copper foils 1, 1 on opposite sides thereof. Hence, at this time it may be desirable to provide means for interconnecting the word straps to be formed above and below the memory plane. One of the techniques commonly used in the art is to form plated-through holes wherein suitable apertures may be drilled in the composite sheet 28 at selected locations, which holes may then be internally plated, thereby forming an electrical connection between the upper and lower copper foils 1, 1 via each plated hole. Referring to FIG. 4, using the tooling holes 29 as a reference, a series of holes 30 may be drilled along each lateral edge of the composite sheet 28. These holes 30 may then be plated, using conventional techniques, thereby providing a plurality of interconnections between the upper and lower copper foils 1, 1 of the composite structure 28.

Referring to FIG. 5, the next step in the process is to etch away the unwanted portions of the copper foils 1, 1 above and below the composite structure 28, so as to form a plurality of parallel word straps 31. Again, the tooling holes 29 are used as a guide, and in accordance with conventional techniques, it is possible to obtain substantially perfect registration between the word straps 31 above and below the composite sheet 28. As illustrated in FIG. 5, the word straps are disposed generally orthagonally with respect to the manufacture wires 20. At this point in the process, the composite sheet 28 may be cut to the desired length and during the shearing operation it is desirable to leave a portion of the manufacture wires 20 exposed at each end of the composite sheet.

The next step in the subject process is to remove the manufacture wires 20 to form a plurality of generally parallel holes or tunnels extending perpendicular to the word straps 31. The final step in the subject method is to insert a magnetically plated wire 32 in each of the tunnels, thereby completing the memory plane, an example of which is illustrated in FIG. 6.

It is readily appreciated from the foregoing description of the method of making a thin memory plane, that the subject process provides a means for ensuring proper registration between the word straps disposed on opposite sides of the plated wires, and in addition provides a means for minimizing the distance between the word straps and the plated wires. Furthermore, the resulting process includes a minimum number of steps leading to a completed structure. The minimizing of the number of lamination steps by the subject process is especially advantageous since subjecting a composite structure to heat and pressure has, according to the prior art techniques, given rise in prior art processes, to misregistration of word straps and undesirable manufacturing tolerances of resulting memory planes. Another important advantage, is the capability of the subject process to produce a plated wire memory in substantially a continuous operation thereby reducing the cost of manufacture and materials.

Although the invention has been described with reference to a preferred embodiment, it should be appreciated that several variations and modifications of the concept disclosed herein are possible without departing from the scope and spirit of the invention. As one example, U-shaped clips may be employed to interconnect the word straps disposed on opposite sides of the plated memory, thereby obviating the necessity for drilling holes along the lateral edges of the composite structure and plating said holes in order to provide an electrical interconnection between the word straps. In addition, means other than an optical scanning device may be employed to provide a continuous monitoring system to determine the relative spacing between adjacent manufacture wires during the lamination technique of the composite structure. Accordingly, the appended claims are not to be construed as limited to the preferred modes disclosed herein.

What is claimed is:

1. A method of making a plated wire memory plane comprising the steps of:
providing a sheet material of perforated copper foil bonded to a dielectric material;
laminating two of said sheet materials and a plurality of generally parallel hole-forming wires to form a composite laminated sheet clad on its opposite sides with the perforated copper foils and wherein the hole-forming wires are embedded in the dielectric material;
etching the copper foil to form a plurality of word straps;
removing the hole-forming wires to form a plurality of spaced holes within the dielectric material; and
inserting magnetically plated wires into said holes in said dielectric material.

2. A method of making a plated wire memory plane as in claim 1 wherein the sheet material of perforated copper foil bonded to a dielectric material is formed by the steps of:
bonding a sheet of copper foil to a dielectric material; and
etching a series of apertures in said copper foil.

3. A method of making a plated wire memory plane as in claim 2 wherein the steps of bonding copper foil to the dielectric material, and etching apertures in the copper foil are performed in a continuous process.

4. A method of making a plated wire memory plane as in claim 1 wherein tooling holes are formed in the composite laminated sheet prior to the etching of the copper foils to form a plurality of word straps, which tooling holes provide a reference for ensuring registration of the word straps above and below the dielectric material.

5. A method of making a plated wire memory plane as in claim 1 wherein a plurality of holes are drilled through the composite laminated sheet prior to the etching of the copper foils, which holes are subsequently plated with conductive material to form electrical interconnections between the subsequently formed word straps above and below the dielectric material.

6. A method of making a plated wire memory plane as in claim 1 including the step of monitoring the pitch between adjacent hole-forming wires subsequent to the step of forming the composite laminated sheet.

7. A method of making a plated wire memory plane as in claim 6 wherein optical scanning means are employed to monitor the pitch between adjacent hole-forming wires.

8. A method of making a plated wire memory plane comprising the steps of:
bonding a sheet of copper foil to a sheet of dielectric material;
etching a series of apertures in said copper foil;
laminating two of said perforated, copper-clad dielectric sheet materials and a plurality of generally parallel hole-forming wires to form a composite laminated sheet clad on its opposite sides with the perforated copper foils and wherein the hole-forming wires are embedded in the dielectric material;
forming tooling holes in the composite laminated sheet;
drilling a plurality of holes through the composite laminated sheet, and plating said holes with conductive material to form electrical interconnections between the subsequently formed word straps above and below the dielectric material;
etching the copper foils to form a plurality of word straps;
removing the hole-forming wires to form a plurality of spaced holes within the dielectric material; and
inserting magnetically plated wires into the said holes in said dielectric material.

9. A method of making a plated wire memory plane as in claim 8 wherein the steps of bonding the copper foil to the dielectric material and etching apertures in the copper foil are performed in a continuous process.

10. A method of making a plated wire memory plane as in claim 8 including the step of monitoring the pitch between adjacent hole-forming wires subsequent to the step of forming the composite laminated sheet.

* * * * *